United States Patent
Aga et al.

(10) Patent No.: US 9,337,080 B2
(45) Date of Patent: May 10, 2016

(54) METHOD FOR MANUFACTURING SOI WAFER

(71) Applicant: SHIN-ETSU HANDOTAI CO., LTD., Tokyo (JP)

(72) Inventors: Hiroji Aga, Takasaki (JP); Isao Yokokawa, Takasaki (JP); Toru Ishizuka, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/428,700

(22) PCT Filed: Nov. 7, 2013

(86) PCT No.: PCT/JP2013/006560
§ 371 (c)(1),
(2) Date: Mar. 17, 2015

(87) PCT Pub. No.: WO2014/091670
PCT Pub. Date: Jun. 19, 2014

(65) Prior Publication Data
US 2015/0249035 A1 Sep. 3, 2015

(30) Foreign Application Priority Data
Dec. 14, 2012 (JP) ................................ 2012-274110

(51) Int. Cl.
*H01L 21/762* (2006.01)
*H01L 21/02* (2006.01)
(Continued)

(52) U.S. Cl.
CPC ...... *H01L 21/76254* (2013.01); *H01L 21/0223* (2013.01); *H01L 21/02032* (2013.01);
(Continued)

(58) Field of Classification Search
CPC ............ H01L 21/76254; H01L 21/265; H01L 21/0223; H01L 27/12; H01L 21/02032; H01L 21/02255; H01L 2924/00; H01L 2224/32225; H01L 2224/32145; H01L 2924/10253; H01L 2224/16145; H01L 21/84; H01L 27/1203; H01L 2224/80001; H01L 2924/01002; H01L 2225/06589; H01L 21/76898; H01L 27/14687; H01L 21/2007; H01L 21/3226; H01L 21/324; H01L 21/7624; H01L 21/020002; H01L 21/76251; H01L 2224/80097
USPC .................................................. 438/795, 458
See application file for complete search history.

(56) References Cited

U.S. PATENT DOCUMENTS

| | | | |
|---|---|---|---|
| 6,306,730 B2 * | 10/2001 | Mitani | ............................ 148/33 |
| 2002/0061660 A1 * | 5/2002 | Ito | ...................... H01L 21/3226 438/795 |

(Continued)

FOREIGN PATENT DOCUMENTS

| | | |
|---|---|---|
| EP | 1 855 309 A1 | 11/2007 |
| JP | H098124 A | 1/1997 |

(Continued)

OTHER PUBLICATIONS

Jun. 16, 2015 International Preliminary Report on Patentability issued in International Application No. PCT/JP2013/006560.

(Continued)

*Primary Examiner* — Caleen Sullivan
(74) *Attorney, Agent, or Firm* — Oliff PLC

(57) ABSTRACT

The present invention is a method for manufacturing an SOI wafer, including: implanting one or more gas ion selected from a hydrogen ion and a rare gas ion into a bond wafer composed of a semiconductor single crystal substrate from a surface of the bond wafer to form an ion-implanted layer; bonding the surface from which the ion is implanted into the bond wafer and a surface of a base wafer through an oxide film; and then delaminating the bond wafer at the ion-implanted layer by performing a delamination heat treatment with a heat treatment furnace to form the SOI wafer, wherein after the delamination heat treatment, a temperature of the heat treatment furnace is decreased to 250° C. or less at temperature-decreasing rate of less than 3.0° C/min, and then the SOI wafer and the bond wafer after delamination are taken out from the heat treatment furnace.

15 Claims, 4 Drawing Sheets

(51) Int. Cl.
*H01L 21/265* (2006.01)
*H01L 27/12* (2006.01)

(52) U.S. Cl.
CPC ........ *H01L21/265* (2013.01); *H01L 21/76251* (2013.01); *H01L 27/12* (2013.01); *H01L 21/02255* (2013.01)

(56) References Cited

U.S. PATENT DOCUMENTS

| | | | |
|---|---|---|---|
| 2005/0118789 | A1 | 6/2005 | Aga et al. |
| 2008/0315349 | A1 | 12/2008 | Takei et al. |
| 2008/0318394 | A1 | 12/2008 | Kakehata et al. |
| 2010/0112824 | A1* | 5/2010 | Yokokawa ........ H01L 21/02238 438/770 |
| 2011/0039395 | A1 | 2/2011 | Ohnuma et al. |
| 2011/0201176 | A1* | 8/2011 | Ramappa .......... H01L 21/76254 438/458 |

FOREIGN PATENT DOCUMENTS

| | | |
|---|---|---|
| JP | 2003347176 A | 12/2003 |
| JP | 2004221198 A | 8/2004 |
| JP | 2006270039 A | 10/2006 |
| JP | 2008300435 A | 12/2008 |
| JP | 2009283582 A | 12/2009 |
| WO | 2012012138 A2 | 1/2012 |

OTHER PUBLICATIONS

Jan. 21, 2014 International Search Report issued in International Application No. PCT/JP2013/006560.

Feb. 16, 2016 extended European Search Report issued in Application No. 13863262.5.

\* cited by examiner

METHOD FOR MANUFACTURING SOI WAFER

TECHNICAL FIELD

The present invention relates to a method for manufacturing an SOI wafer by the ion implantation delamination method.

BACKGROUND ART

In manufacture of an SOI wafer by the ion implantation delamination method, when a bond wafer for forming an SOI layer (Silicon On Insulator layer, or Semiconductor On Insulator in a broad sense) and a base wafer are bonded through an oxide film, and then subjected to a heat treatment (a delamination heat treatment) to perform a delamination at an ion-implanted layer, the wafers just after delamination are taken out from a heat treatment furnace with which the delamination heat treatment has been performed in a state that an SOI layer surface (a delaminating plane) of the SOI wafer faces to a surface (a delaminating plane) of the bond wafer (See Patent Document 1, etc.).

When a bond wafer on which an oxide film has been formed and a base wafer are bonded to manufacture an SOI wafer, the SOI wafer warps in a convex shape on the delaminating plane side due to a buried oxide film which has been transferred from a surface of the bond wafer by the delamination heat treatment, whereas the bond wafer after delamination warps in a concave shape on the delaminating plane side in contrast to the SOI wafer because the front surface oxide film is separated and the oxide film remains only on the back surface. Although a magnitude of the warpage is determined depending on a thickness of the transferred oxide film, a contact between the SOI wafer and the bond wafer after delamination hardly occurs because magnitudes of the warpages of these wafers are almost the same.

In practice, however, there is also the influence of a warp shape formed during wafer processing. Therefore, for example, if the bond wafer warps convexly during wafer processing, the bond wafer after delamination is formed into a shape obtained by subtracting the convex shape formed during the wafer processing from the concave shape due to the influence of the back surface oxide film.

In this case, a mismatch in warp shape between the SOI wafer and the bond wafer after delamination is caused. More specifically, a magnitude of the concave warp of the bond wafer after delamination becomes small compared with a magnitude of the convex warp of the SOI wafer.

In addition, in the ion implantation delamination method by the so-called coimplantation in which the ion implantation is performed by implanting two types of ion, for example, a hydrogen ion and a helium ion to form an ion-implanted layer at which delamination is caused, if the helium ion is implanted more deeply than the hydrogen ion, a helium ion-implanted layer remains in the bond wafer still after delamination while a hydrogen ion-implanted layer is divided into an SOI side and the bond wafer after delamination because the delamination is caused at the hydrogen ion-implanted layer. In this case, warping force by which the bond wafer after delamination is warped so as to have a convex shape operates on the bond wafer after delamination by existence of the helium ion-implanted layer, thereby causing the mismatch in warp shape with the SOI wafer.

CITATION LIST

Patent Literature

Patent Document 1: Japanese Unexamined Patent publication (Kokai) No. 2009-283582

SUMMARY OF INVENTION

Technical Problem

The present inventors keenly conducted studies the above-mentioned method for manufacturing an SOI wafer by the ion implantation delamination method, and consequently found that, in the manufactured SOI wafer, SOI film thickness abnormalities in which a portion having a thin SOI film thickness is generated at a center portion of the SOI wafer are caused, and scratches occur at the thin film portion as shown in FIG. 4.

The present invention was accomplished in view of the above-described problems. It is an object of the present invention to provide a method for manufacturing an SOI wafer that can inhibit scratches and SOI film thickness abnormalities.

Solution to Problem

To achieve this object, the present invention provides a method for manufacturing an SOI wafer, comprising: implanting one or more gas ion selected from a hydrogen ion and a rare gas ion into a bond wafer composed of a semiconductor single crystal substrate from a surface of the bond wafer to form an ion-implanted layer; bonding the surface from which the ion is implanted into the bond wafer and a surface of a base wafer through an oxide film; and then delaminating the bond wafer at the ion-implanted layer by performing a delamination heat treatment with a heat treatment furnace to form the SOI wafer, wherein after the delamination heat treatment, a temperature of the heat treatment furnace is decreased to 250° C. or less at temperature-decreasing rate of less than 3.0° C./min, and then the SOI wafer and the bond wafer after delamination are taken out from the heat treatment furnace.

In the present invention, first of all, the temperature inside the heat treatment furnace during taking out the SOI wafer and the bond wafer of 250° C. or less enables the formation of an oxide film during taking out the wafers to be inhibited. Even if a tip part of the convex shape of the SOI wafer is in contact with the bond wafer after delamination because of the mismatch, the occurrence of the conventional film thickness abnormalities at the tip part of the convex shape of the SOI wafer can be inhibited since the formation of the oxide film during taking out the wafers is inhibited on all surfaces of the wafer from the beginning.

Moreover, in the present invention, the temperature-decreasing rate of less than 3.0° C./min enables a temperature distribution of the wafer surface to be small during decreasing the temperature, so that a deformation of the wafer due to the temperature distribution can be reduced. Therefore, the occurrence of scratches of the SOI wafer can be inhibited.

Thus, the present invention enables an SOI wafer in which scratches and SOI film thickness abnormalities are inhibited to be obtained.

In the method, a semiconductor single crystal substrate having a front surface oxide film and a back surface oxide film may be prepared as the bond wafer for forming the ion-implanted layer to implant the ion through the front surface oxide film, the back surface oxide film being thicker than the front surface oxide film.

In this manner, the bond wafer after delamination is formed into a concave shape by a difference in film thickness among the oxide films, therefore the mismatch in warp shape between the SOI wafer and the bond wafer after delamination can be prevented, and the occurrence of scratches and SOI film thickness abnormalities due to the contact can be more greatly inhibited.

Moreover, a wafer may be used as the semiconductor single crystal substrate having the back surface oxide film thicker than the front surface oxide film, the wafer being manufactured by forming a thermal oxide film on all surfaces of a semiconductor single crystal substrate, then removing a portion of the thermal oxide film on a front surface side to obtain a semiconductor single crystal substrate having the thermal oxide film only on a back surface side thereof, and thermally oxidizing the semiconductor single crystal substrate having the thermal oxide film only on the back surface side.

In this manner, the difference in film thickness between the oxide film on the front surface that will become a surface to be bonded and the oxide film on the back surface can be appropriately adjusted.

Moreover, before the semiconductor single crystal substrate having the thermal oxide film only on the back surface side is thermally oxidized, the front surface side on which the portion of the thermal oxide film has been removed may be polished.

In this manner, failures during bonding can be inhibited.

Moreover, a wafer manufactured by subjecting the bond wafer delaminated at the ion-implanted layer to a reclaiming process may be used as the semiconductor single crystal substrate having the back surface oxide film thicker than the front surface oxide film.

In this manner, an SOI wafer can be manufactured economically.

In the method, the reclaiming process may be performed without removing the back surface oxide film of the delaminated bond wafer.

In this manner, it is easy to adjust the difference in film thickness among the oxide films of the bond wafer.

Moreover, the ion implantation may be performed by a coimplantation of a hydrogen ion and a helium ion such that the helium ion is implanted more deeply than the hydrogen ion.

The present invention can suppress the influence on warping of the bond wafer after delamination due to existence of the helium ion-implanted layer, and thereby prevent the mismatch in warp shape between the SOI wafer and the bond wafer after delamination, even if the helium ion is implanted more deeply than the hydrogen ion.

Advantageous Effects of Invention

As described above, the present invention can prevent the contact between the SOI wafer and the bond wafer after delamination due to the mismatch in relation to the delamination heat treatment in the ion implantation delamination method. In addition to this, a formation irregularity of the oxide film during taking out the wafers from the heat treatment furnace can be prevented even if the mismatch is caused. In this way, the occurrence of scratches and SOI film thickness abnormalities at the tip part of the convex shape of the SOI wafer can be inhibited.

DESCRIPTION OF EMBODIMENTS

Figure 1:
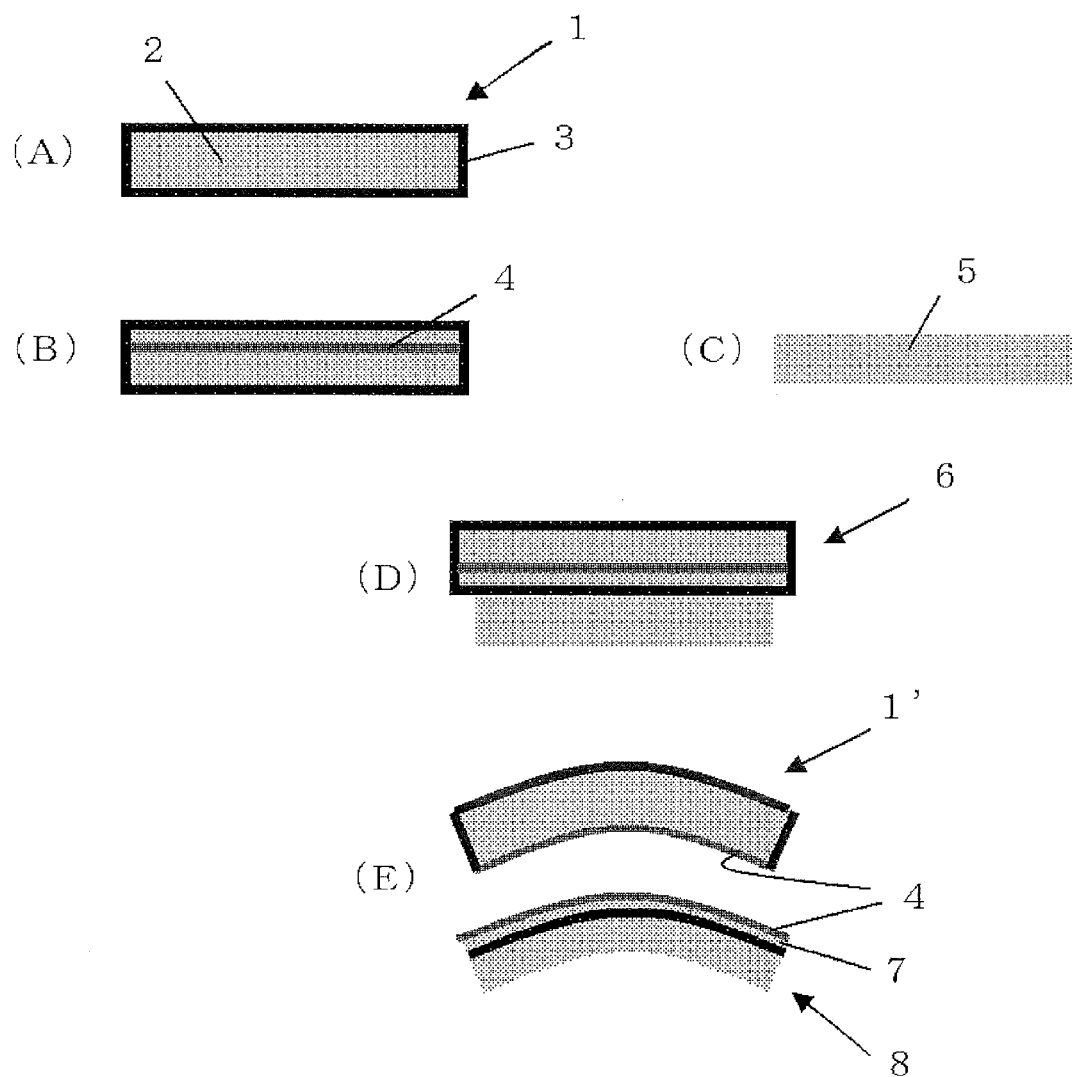
FIG. 1 is a flow chart of an example of the inventive method for manufacturing an SOI wafer.

Hereinafter, embodiments of the present invention will be described in detail with reference to the drawings, but the present invention is not limited thereto.

The background of how the present inventors accomplished the present invention will now be described in detail.

The present inventors found that, in the delamination heat treatment of the ion implantation delamination method for manufacturing an SOI wafer, if a magnitude of the concave shape of the bond wafer after delamination (the delaminated bond wafer) is smaller than that of the convex shape of the SOI wafer, a mismatch in warp shape is caused between the delaminated bond wafer and the SOI wafer, a tip part of the convex shape of the SOI layer surface is thereby brought into contact with the delaminated bond wafer in the delamination heat treatment process, and scratches and SOI film thickness abnormalities are likely to occur at a center portion of the SOI wafer and the like.

In the case of bonding with the bond wafer on which a thermal oxide film has been formed, the SOI wafer warps convexly toward the delaminating plane side in proportion to the film thickness of the buried oxide film. On the other hand, in the delaminated bond wafer, the delaminating plane side warps concavely by action of the oxide film on the back surface because the oxide film on the front surface is separated by the delamination.

As described above, a magnitude of the convex shape of the SOI wafer is usually equal to a magnitude of the concave shape of the delaminated bond wafer, so that the tip part of the convex shape of the SOI wafer is hardly in contact with the delaminated bond wafer.

However, the above-mentioned mismatch possibly occurs, for example, by the influence of a warp shape formed in wafer processing.

First, the present inventors investigated a mechanism of causing film thickness abnormalities.

As a result, they found that the formation of an oxide film is inhibited at a contact portion in which the tip part of the convex shape of the SOI layer surface is in contact with the delaminated bond wafer, compared with a portion not in contact with the same. In this case, a thickness of the oxide film formed on the contact portion becomes thinner, and Si etching is started from the contact portion in SC1 cleaning of RCA cleaning (a cleaning with a mixed aqueous solution of $NH_4OH$ and $H_2O_2$) after delamination. Thus, it was revealed that the SOI film thickness of the tip part of the convex shape is reduced after cleaning.

Then, a method is devised in which after the delamination heat treatment with a heat treatment furnace, the take-out temperature inside the heat treatment furnace is set at 250° C. or less to inhibit the formation of an oxide film on the SOI wafer surface in order to improve non-uniformity in thickness of the oxide film to be formed on the SOI layer surface after delamination. If the wafers are taken out from the furnace at a temperature exceeded 250° C., an oxide film is formed on the SOI wafer surface by oxygen contained in air. Therefore, non-uniformity in oxide film thickness between the wafer contact portion and the non-contact portion is caused.

The take-out temperature of 250° C. or less can inhibit the oxide film from being formed on the surface during taking out the wafers from the beginning, thereby minimize an oxide film thickness distribution of the wafer surface. Si etching is therefore performed uniformly in a plane in the subsequent SC1 cleaning, and the occurrence of the conventional film thickness abnormalities can be inhibited.

In addition, as for scratches, the temperature-decreasing rate of less than 3.0° C./min at which the temperature is decreased to the take-out temperature of 250° C. or less after the SOI layer is delaminated in the delamination heat treatment (for example, at from 400 to 600° C.) can minimize a temperature distribution of the wafer surface during decreasing the temperature, and inhibit scratching of the SOI wafer and the delaminated bond wafer due to a deformation of the wafer. If the temperature-decreasing rate is 3.0° C./min or more, a radial temperature distribution during decreasing the temperature is increased, and scratches easily occur because the wafer is deformed by a difference in thermal expansion coefficients.

The present inventors found the foregoing, thereby brought the present invention to completion.

Hereinafter, the inventive method for manufacturing an SOI wafer will be described in detail.

(First Embodiment)

FIG. 1 shows an example of the inventive method for manufacturing an SOI wafer.

First, a semiconductor single crystal substrate 2 is prepared as the bond wafer 1 to form an oxide film 3 (FIG. 1 at (A)).

The semiconductor single crystal substrate used as the bond wafer is preferably a silicon single crystal wafer. In addition, a germanium single crystal wafer, a germanium epitaxial wafer, an SiGe epitaxial wafer, a strained silicon wafer or an SiC single crystal wafer can also be used alternatively. In this embodiment, the case of using a silicon single crystal wafer is described.

Also, a method for forming the oxide film 3 is not particularly limited to, the oxide film may be formed by thermal oxidation, for example.

Next, ions are implanted into the semiconductor single crystal substrate 1 having the oxide film 3 formed thereon from a side to be bonded (a front surface side) to form an ion-implanted layer (FIG. 1 at (B)).

The ion-implanted layer may be, for example, a layer formed by implanting one or more gas ion selected from a hydrogen ion and a rare gas ion. In this embodiment, the case of implanting hydrogen ions (a hydrogen ion-implanted layer 4) is described as an example.

Subsequently, the surface from which the ions are implanted into the bond wafer 1 and a surface of the base wafer 5 are bonded through the oxide film 3, for example, at room temperature of from 20 to 30° C. to form a bonded wafer 6 (FIG. 1 at (C) and (D)). In this case, a plasma treatment may also be performed on a surface to be bonded of at least one of the bond wafer and the base wafer before bonding to increase the bonding strength obtained at room temperature.

Also, as the base wafer 5, a silicon single crystal wafer or a silicon single crystal wafer on which an insulator film has been formed can be used, for example.

Then, the bonded wafer 6 is loaded into a heat treatment furnace and heated, then the delamination heat treatment is performed at a prescribed temperature. The delamination heat treatment temperature may be, for example, 400° C. or more, preferably from 400 to 600° C. The temperature in the above range enables the bonded wafer 6 to be appropriately delaminated at the hydrogen ion-implanted layer 4, and thereby a delaminated bond wafer 1' and an SOI wafer 8 having an SOI layer 7 can be obtained (FIG. 1 at (E)).

Here, a batch type furnace can be used as the heat treatment furnace, for example. This is not a limitation, provided the delamination heat treatment can be appropriately performed on wafers and a temperature inside the furnace can be decreased at a later-explained temperature-decreasing rate.

After the delamination heat treatment is performed as described above, a temperature inside the heat treatment furnace is decreased at a rate of less than 3.0° C./min. The SOI wafer 8 and the delaminated bond wafer 1' are then taken out under the temperature decreased to 250° C. or less.

In this way, the decreasing of the temperature at the rate of less than 3.0° C./min can reduce a temperature distribution of each wafer surface during decreasing the temperature, and inhibit scratching of the SOI wafer 8 and the delaminated bond wafer 1° due to a deformation of the wafer. Therefore, the occurrence of scratches can be prevented.

In addition, the temperature-decreasing rate is preferably 2.5° C./min or less. A lower limit thereof is not particularly limited to, but preferably 1.0° C./min or more to perform the heat treatment process efficiently.

Moreover, the take-out temperature of 250° C. or less can inhibit an oxide film from being formed on the surface during taking out the wafers. Therefore, even if a mismatch between the SOI wafer 8 and the delaminated bond wafer 1' is caused, there is no possibility that the oxide film in a tip part of the convex shape of the SOI wafer is formed thinly than other portion unlike in the conventional manner, and a radial oxide film thickness distribution can be minimized. Therefore, a formation irregularity of the oxide film thickness can be inhibited, Si etching is uniformly performed in a radial direction by the subsequent step of SC1 cleaning, and the occurrence of the conventional film thickness abnormalities of the SOI wafer can be prevented.

In this way, the SOI wafer 8 in which scratches are inhibited and the occurrence of SOI film thickness abnormalities is also inhibited can be obtained.

(Second Embodiment)

In the first embodiment, as the bond wafer, the case of using the semiconductor single crystal substrate in which a thermal oxide film is merely formed on all surfaces thereof has been described.

However, in addition to this, the present invention can also use a semiconductor single crystal substrate having a back surface oxide film thicker than a front surface oxide film (an oxide film formed on the side to be bonded) as the bond wafer. This case is now described with reference to FIG. 2.

Figure 2:
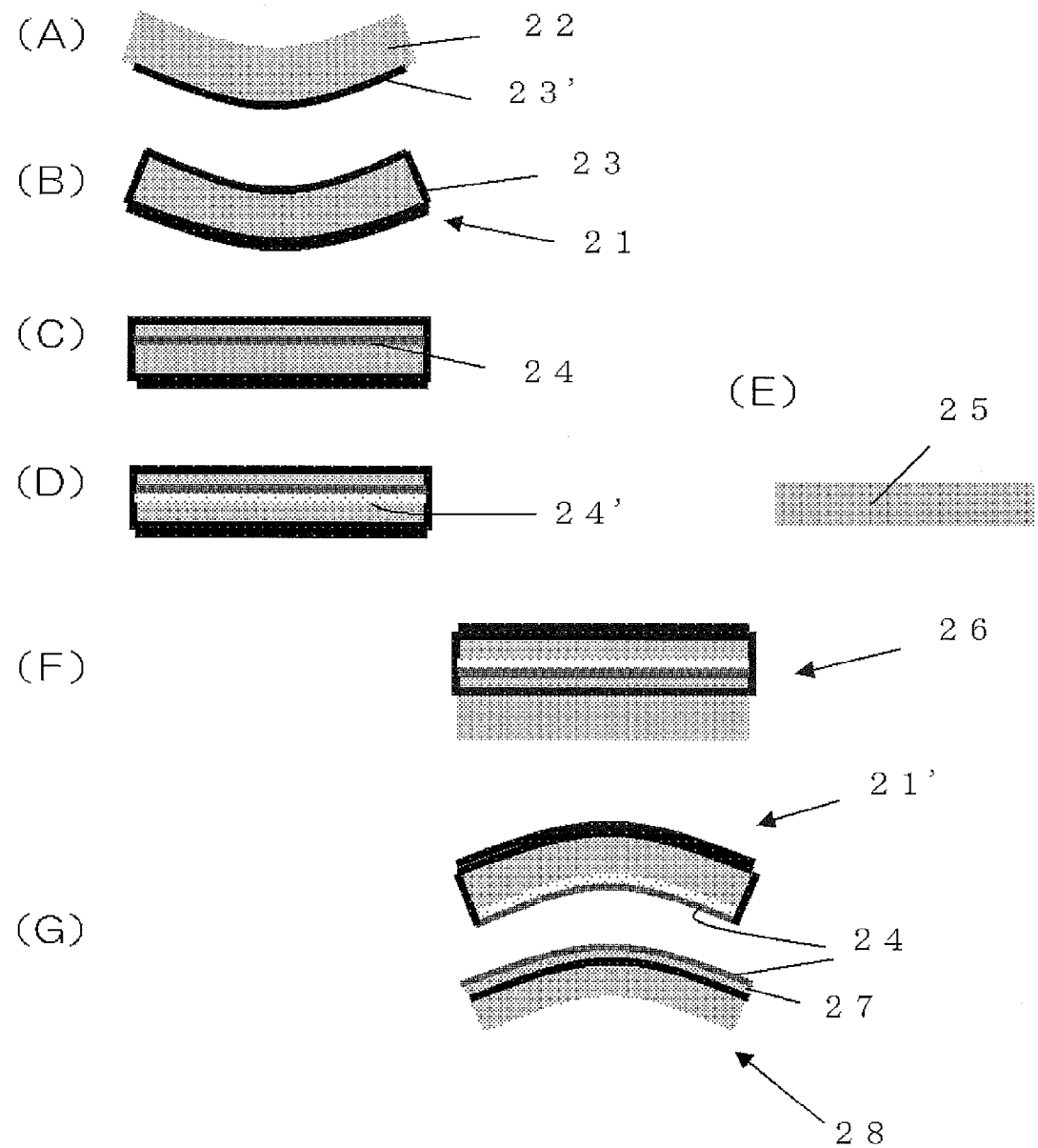
FIG. 2 is a flow chart of an another example of the inventive method for manufacturing an SOI wafer.

First, an oxide film 23' is formed on a back surface of a semiconductor single crystal substrate 22 (FIG. 2 at (A)). The oxide film 23' on the back surface is preferably a thermal oxide film, for example. A preferable method for forming the same is to manufacture a bond wafer having a thermal oxide film only on the back surface by forming a thermal oxide film on all surfaces of the bond wafer, and then removing a portion of the thermal oxide film on the side to be bonded of the bond wafer.

Other methods for forming the oxide film 23' on the back surface include a method in which after forming a thermal oxide film having almost uniform thickness on all surfaces of the semiconductor single crystal substrate, while a part of the oxide film on the back surface is protected by a ring-shaped rubber (O-ring) or a protective sheet such as PVC, the semiconductor single crystal substrate is brought into contact with an etching solution for oxide film, or a method in which a part of the thermal oxide film is removed on the side to be bonded with a solution containing hydrogen fluoride (HF) by a spin etching etc. to remain the oxide film only on the back surface.

Next, another oxide film is formed on the semiconductor single crystal substrate 22 having the oxide film 23' formed on the back surface (FIG. 2 at (B)). Another oxide film is preferably a thermal oxide film. A preferable method for forming the same is to thermally oxidize all surfaces of the bond wafer having the back surface oxide film formed thereon. In this way, the wafer having the oxide film 23 in which the back surface side is thicker than the front surface side that will become the surface to be bonded of the semiconductor single crystal substrate 22 can be obtained. The bond wafer 21 having an oxide film different in thickness in front and back is thus manufactured.

Also, if failures during bonding are caused by a deterioration in surface roughness of the surface to be bonded of the bond wafer or an attachment of a particle due to the formation of the oxide film on the back surface and the removing of the oxide film on the side to be bonded (the front surface side), the method may comprise a step of polishing the side to be bonded by using chemical mechanical polishing (CMP) etc. after removing the oxide film on the side to be bonded, and then thermal oxidation may be performed on all surfaces (FIG. 2 between (A) and (B)).

As described above, the bond wafer 21 in which the oxide film on the back surface is thicker than the oxide film on the front surface that will become the surface to be bonded can be previously formed into a concave shape before boding to the base wafer, and thereby the contact between the delaminated bond wafer and the SOI wafer can be inhibited. Moreover, this can inhibit the bond wafer from excessively warping and having a convex shape, thereby enabling the inhibition of the occurrence of the mismatch, even if a helium ion-implanted layer is formed as explained later.

In addition, a degree of how thickly the oxide film on the back surface is formed compared with the oxide film on the surface to be bonded can be appropriately determined by experiments and calculations based on specifications of the SOI wafer to be manufactured (such as diameter, base wafer thickness and BOX layer thickness) and specifications of the bond wafer to be used (such as diameter and wafer thickness) so as to prevent the mismatch just after delamination (so that a magnitude of the convex shape of the SOI wafer is equal to a magnitude of the concave shape of the delaminated bond wafer).

Next, ions are implanted into the bond wafer 21 having the oxide film 23 formed thereon from the side to be bonded (the front surface side) to form an ion-implanted layer.

In the first embodiment, the case of forming only the hydrogen ion-implanted layer has been described. Here, the case of forming a co-implanted layer by implanting both of hydrogen ions and helium ions will be described as an example.

When a coimplantaion using hydrogen ions and helium ions is performed as the ion implantation, first, hydrogen ions are implanted to form a hydrogen ion-implanted layer 24 (FIG. 2 at (C)). Next, it is preferable that helium ions are implanted more deeply than the hydrogen ion-implanted layer 24 to form a helium ion-implanted layer 24' (FIG. 2 at (D)). The coimplantation thus performed can reduce an amount of ions to be implanted compared with the case of implanting one type of ions.

In the conventional method for manufacturing an SOI wafer, if hydrogen ions and helium ions are co-implanted, the delaminated bond wafer is formed into convex shape by existence of the helium ion-implanted layer, so that the mismatch in warp shape with the SOI wafer occurs, resulting in scratches and SOI film thickness abnormalities.

However, as shown in FIG. 2 at (B), the thick thickness of the oxide film on the back surface enables the warp shape of the bond wafer to be previously adjusted before bonding, thereby the influence by existence of the helium ion-implanted layer 24' can be minimized.

Next, the surface from which the ions are implanted into the bond wafer 21 and a surface of the base wafer 25 are bonded through the oxide film 23, for example, at room temperature of from 20 to 30° C. to form a bonded wafer 26 (FIG. 2 at (E) and (F)).

Then, the bond wafer is delaminated from the bonded wafer 26 at the hydrogen ion-implanted layer 24 by the delamination heat treatment so as to obtain a delaminated bond wafer 21', and thereby forming an SOI wafer 28 having an SOI layer 27 (FIG. 2 at (G)). The delamination heat treatment conditions may be set, for example, as in the first embodiment.

In the second embodiment, since the bond wafer having the oxide film in which the back surface side is thicker than the front surface side is used, the delaminated bond wafer 21' warps in a concave shape more reliably, and the conventional contact due to the mismatch in shape between the delaminated bond wafer and the SOI wafer can be prevented.

Therefore, an SOI wafer in which scratches and SOI film thickness abnormalities after Si etching are further inhibited can be obtained more stably.

(Third Embodiment)

In addition, the method for manufacturing an SOI wafer by the ion implantation delamination method is also characterize by being capable of reusing a delaminated bond wafer. Therefore, the present invention can also use a wafer manufactured by subjecting the delaminated bond wafer 21' and the like to a reclaiming process as the bond wafer. Thus, it is advantageous in a cost.

In that case, the delaminated bond wafer is reclaimed by performing the reclaiming process without removing the oxide film on the back surface to manufacture a bond wafer having an oxide film on the back surface. The resultant wafer is then thermally oxidized, and thereby the bond wafer in which the oxide film on the back surface is thicker than the oxide film on the surface to be bonded can be easily manufactured.

In this reclaiming process of the delaminated bond wafer, a removal of the oxide film remaining on an outer circumferential unbonded portion on the side to be bonded may be accomplished by directly polishing the side to be bonded. Alternatively, the removal may be performed using a method in which the delaminated bond wafer is brought into contact with an etching solution for oxide film while a part of the oxide film on the back surface is protected by a ring-shaped rubber (O-ring) or a protective sheet such as PVC, or using a spin etching machine.

In the reclaiming process of the delaminated bond wafer, the back surface oxide film may be protected by blocking an etching solution or an etching gas by means of an O-ring, or by attaching a protective sheet, such as PVC, to the back surface of the delaminated bond wafer, as described above. A possible alternative way is performed such that an etching solution or an etching gas does not reach the back surface of the bond wafer because of wind pressure and centrifugal force generated by the rotation of the wafer. The etching solution for oxide film is preferably a HF solution. Alternatively, the etching may be performed with a HF gas. The O-ring is desirably provided at a position several millimeters from the outer circumference to warp the bond wafer. Depending on a permissible level of warping, however, it may be provided within the inside of this range.

By subjecting the bond wafer having the back surface oxide film thicker than the front surface oxide film that is thus manufactured by reclaiming the delaminated bond wafer, to the steps of (C) to (G) in FIG. 2 as in the second embodiment, for example, an SOI wafer in which scratches and SOI film thickness abnormalities after Si etching are further inhibited can be obtained.

EXAMPLE

Hereinafter, the present invention will be more specifically described with reference to examples and comparative examples, but the present invention is not limited thereto.

Example 1 and Comparative Examples 1 to 6

A bond wafer consisting of a 300-mm-diameter silicon single crystal wafer both surfaces of which have been mirror-polished was thermally oxidized to form a 30-nm-thickness thermal oxide film on all surfaces thereof, and subjected to the hydrogen ion-implantation though the thermal oxide film. Subsequently, the resultant bond wafer was bonded to a base wafer consisting of a 300-mm-diameter silicon single crystal wafer to manufacture a bonded wafer. The delamination heat treatment was then performed (at 500° C., for 30 min, in nitrogen atmosphere) to delaminate a part of the bond wafer from the bonded wafer so that an SOI wafer was manufactured, and subjected to an SC1 cleaning.

In addition, the temperature-decreasing rate and the take-out temperature inside the heat treatment furnace were set as follows.

Example 1 Temperature-decreasing rate: 2.0° C./min, Take-out temperature: 250° C.;
Comparative Example 1 Temperature-decreasing rate: 3.0° C./min, take-out temperature: 250° C.;
Comparative Example 2 Temperature-decreasing rate: 3.0° C./min, take-out temperature: 225° C.;
Comparative Example 3 Temperature-decreasing rate: 3.0° C./rain, take-out temperature: 500° C.;
Comparative Example 4 Temperature-decreasing rate: 3.0° C./min, take-out temperature: 360° C.;
Comparative Example 5 Temperature-decreasing rate: 3.0° C./min, take-out temperature: 295° C.;
Comparative Example 6 Temperature-decreasing rate: 5.0° C./min, take-out temperature: 250° C.;

Table 1 shows various conditions, an incidence of scratches and an incidence of SOI film thickness distribution abnormalities of Example 1 and Comparative Examples 1 to 6. Also, FIG. 3 show measurement results of an SOI film thickness distribution of Example 1 and Comparative Examples 3 to 5.

TABLE 1

|  | EXAMPLE 1 | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 |
|---|---|---|---|---|---|---|---|
| BACK SURFACE OXIDE FILM OF THE BOND WAFER | 30 nm | 30 nm | 30 nm | 30 nm | 30 nm | 30 nm | 30 nm |
| FRONT SURFACE OXIDE FILM OF THE BOND WAFER (BURIED OXIDE FILM) | 30 nm | 30 nm | 30 nm | 30 nm | 30 nm | 30 nm | 30 nm |
| H ION IMPLANTAION | 30 KeV, 5e16 cm$^{-2}$ | 30 KeV, 5e16 cm$^{-2}$ | 30 KeV, 5e16 cm$^{-2}$ | 30 KeV, 5e16 cm$^{-2}$ | 30 KeV, 5e16 cm$^{-2}$ | 30 KeV, 5e16 cm$^{-2}$ | 30 KeV, 5e16 cm$^{-2}$ |
| BONDING PROCESS | BONDING AT ROOM TEMPERATURE | BONDING AT ROOM TEMPERATURE | BONDING AT ROOM TEMPERATURE | BONDING AT ROOM TEMPERATURE | BONDING AT ROOM TEMPERATURE | BONDING AT ROOM TEMPERATURE | BONDING AT ROOM TEMPERATURE |
| DELAMINATION HEAT TREATMENT | 500° C., 30 min | 500° C., 30 min | 500° C., 30 min | 500° C., 30 min | 500° C., 30 min | 500° C., 30 min | 500° C., 30 min |
| TEMPERATURE-DECREASING RATE | 2.0° C./min | 3.0° C./min | 3.0° C./min | 3.0° C./min | 3.0° C./min | 3.0° C./min | 5.0° C./min |
| TAKE-OUT TEMPERATURE | 250° C. | 250° C. | 225° C. | 500° C. | 360° C. | 295° C. | 250° C. |
| INCIDENCE OF SCRATCHES | 5% | 10% | 10% | 100% | 50% | 30% | 20% |
| INCIDENCE OF SOI FILM THICKNESS DISTRIBUTION ABNORMALITIES | 5% | 5% | 5% | 100% | 100% | 50% | 40% |

Figure 3:
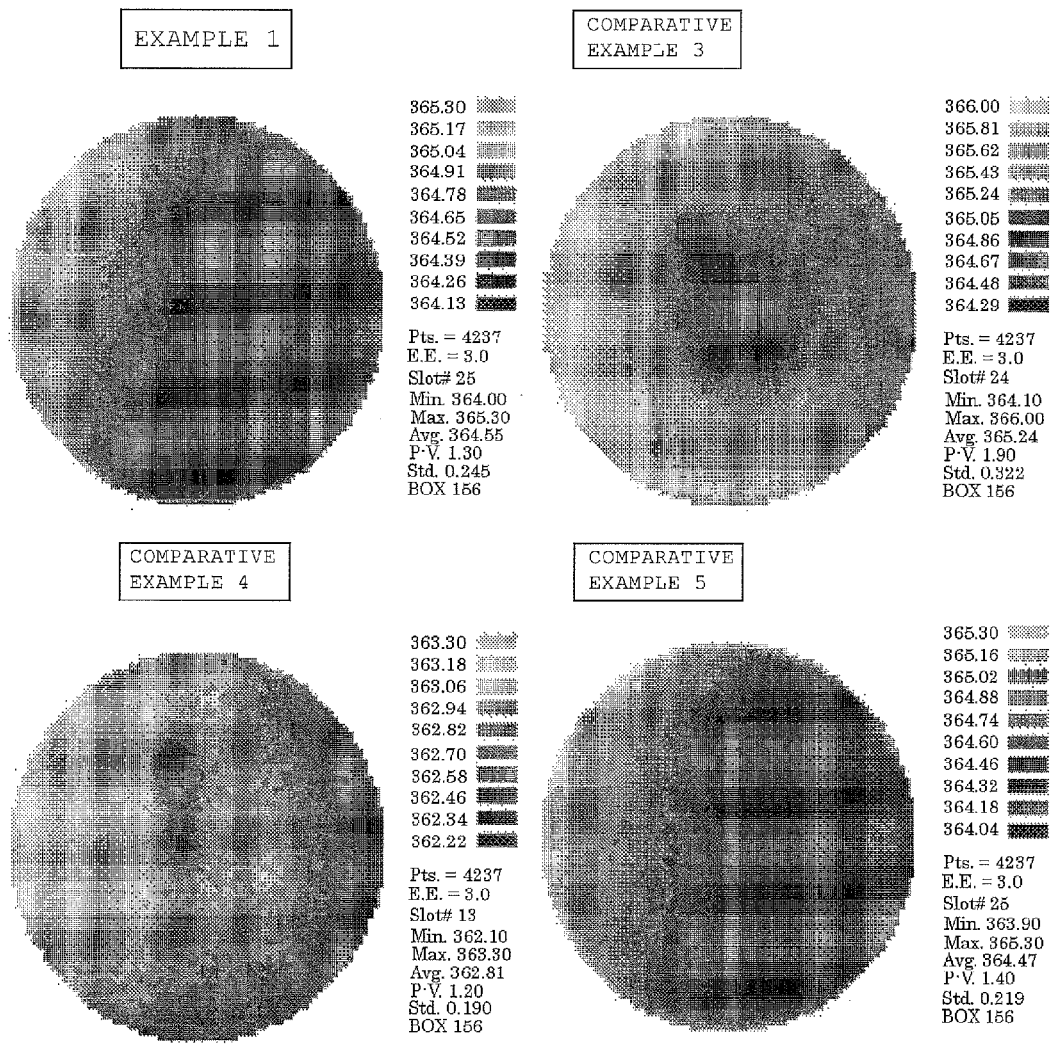
FIG. 3 are diagrams showing measurement results of SOI film thickness distributions of Example 1 and Comparative examples 3 to 5.
Figure 4:
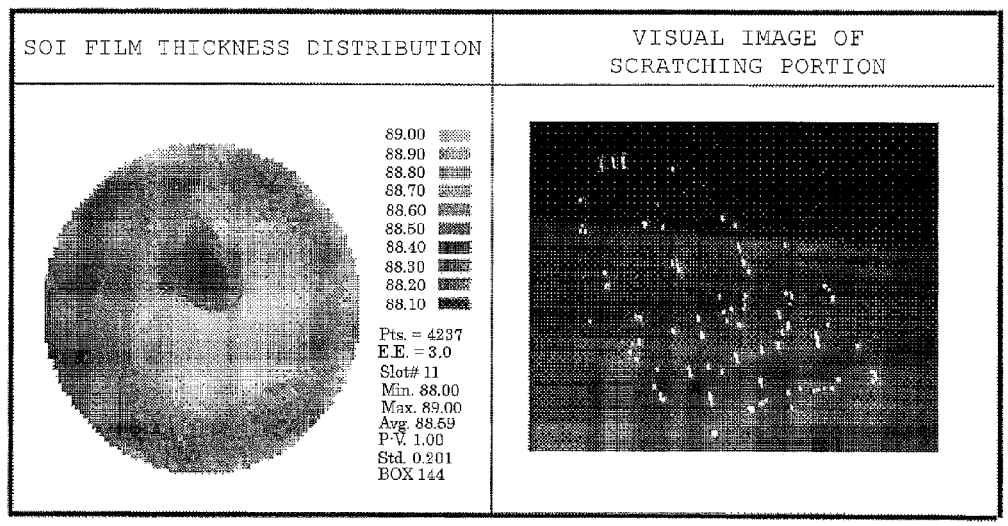
FIG. 4 is a measurement diagram showing scratches and SOI film thickness abnormalities generated at a center portion of the SOI wafer.

As shown in Table 1 and FIG. 3, in Example 1 having performed the inventive method in which the temperature-decreasing rate was less than 3.0° C./min and the take-out temperature was 250° C. or less, the incidence of scratches was limited to a small value of 5%, and the incidence of SOI film thickness distribution abnormalities was suppressed to be 5%. In this way, an excellent SOI wafer free of scratches and SOI film thickness abnormalities could be manufactured at a good yield.

By contrast, in Comparative Examples 1 to 5 in which the temperature-decreasing rate was 3.0° C./min as in the conventional method, the incidence of scratches was 10%, 10%, 100%, 50% and 30%, respectively. These values were from 2 to 20 times that of Example 1.

Moreover, the incidence of scratches was 20% in Comparative Example 6 in which the temperature-decreasing rate was 5.0° C./min and other conditions were the same as in Example 1 (2.0° C./min) and Comparative Example 1 (3.0° C./min). This result was worse than Example 1 and Comparative Example 1.

Moreover, in Comparative Examples 3 to 5 in which the take-out temperature was more than 250° C. unlike the present invention, the incidence of SOI film thickness distribution abnormalities was a high value of 100%, 100% and 50%, respectively.

Example 2

A bond wafer consisting of a 300-mm-diameter silicon single crystal wafer both surfaces of which have been mirror-polished was thermally oxidized to form a 150-nm-thickness thermal oxide film on all surfaces thereof. Then, the bond wafer was immersed in HF aqueous solution while the back surface oxide film thereof was protected by an O-ring to remove the front surface oxide film. After that, the front surface was re-polished by CMP processing, and subjected to the thermal oxidation again to form a 30-nm-thickness thermal oxide film (for a buried oxide film) on the front surface side. At this time, the back surface oxide film grew to be 155 nm. After hydrogen ions were implanted through the 30-nm-thickness thermal oxide film on the front surface side, the resultant bond wafer was bonded to a base wafer consisting of a 300-mm-diameter silicon single crystal wafer. The delamination heat treatment was then performed (at 500° C., for 30 min, in nitrogen atmosphere) to manufacture an SOI wafer, and subjected to an SC1 cleaning.

In addition, the temperature-decreasing rate was set at 2.0° C./min and the take-out temperature inside the heat treatment furnace was set at 250° C.

Example 3

A bond wafer which has been delaminated by the ion implantation delamination method (a delaminated bond wafer having a 150-nm-thickness back surface oxide film) was immersed in HF aqueous solution while the back surface oxide film was protected by an O-ring to remove the front surface oxide film, and then subjected to the reclaiming process by CMP processing. The obtained wafer was used as a bond wafer, and thermally oxidized to form a 30-nm-thickness thermal oxide film (for a buried oxide film) on the front surface side. At this time, the back surface oxide film grew to be 155 nm. After hydrogen ions were implanted through the 30-nm-thickness thermal oxide film on the front surface side, the resultant bond wafer was bonded to a base wafer consisting of a 300-mm-diameter silicon single crystal wafer. The delamination heat treatment was then performed (at 500° C., for 30 min, in nitrogen atmosphere) to manufacture an SOI wafer, and subjected to an SC1 cleaning.

In addition, the temperature-decreasing rate was set at 2.0° C./min and the take-out temperature inside the heat treatment furnace was set at 250° C.

Example 4

A bond wafer consisting of a 300-mm-diameter silicon single crystal wafer both surfaces of which have been mirror-polished was thermally oxidized to form a 150-nm-thickness thermal oxide film on all surfaces thereof. Then, the bond wafer was immersed in HF aqueous solution while the back surface oxide film thereof was protected by an O-ring to remove the front surface oxide film. After that, the front surface was re-polished by CMP processing, and subjected to the thermal oxidation again to form a 30-nm-thickness thermal oxide film (for a buried oxide film) on the front surface side. At this time, the back surface oxide film grew to be 155 nm. After hydrogen ions and helium ions were implanted through the 30-nm-thickness thermal oxide film, the resultant bond wafer was bonded to a base wafer consisting of a 300-mm-diameter silicon single crystal wafer. The delamination heat treatment was then performed (at 500° C., for 30 min, in nitrogen atmosphere) to manufacture an SOI wafer, and subjected to an SC1 cleaning.

In addition, the temperature-decreasing rate was set at 2.5° C./min and the take-out temperature inside the heat treatment furnace was set at 250° C.

Comparative Example 7

A 30-nm-thickness thermal oxide film was formed on a bond wafer consisting of a 300-mm-diameter silicon single crystal wafer both surfaces of which have been mirror-polished. Then, after hydrogen ions and helium ions were implanted through the 30-nm-thickness thermal oxide film, the resultant bond wafer was bonded to a base wafer consisting of a 300-mm-diameter silicon single crystal wafer. The delamination heat treatment was then performed (at 500° C., for 30 min, in nitrogen atmosphere) to manufacture an SOI wafer, and subjected to an SC1 cleaning.

In addition, the temperature-decreasing rate was set at 3.0° C./min and the take-out temperature inside the heat treatment furnace was set at 350° C.

Table 2 shows various conditions, an incidence of scratches and an incidence of SOI film thickness distribution abnormalities of Examples 2 to 4 and Comparative Example 7.

TABLE 2

|  | EXAMPLE 2 | EXAMPLE 3 | EXAMPLE 4 | COMPARATIVE EXAMPLE 7 |
|---|---|---|---|---|
| THE NUMBER OF TIMES OF REUSE OF THE BOND WAFER | 0 | 1 | 1 | 0 |

TABLE 2-continued

|  | EXAMPLE 2 | EXAMPLE 3 | EXAMPLE 4 | COMPARATIVE EXAMPLE 7 |
|---|---|---|---|---|
| BACK SURFACE OXIDE FILM OF THE BOND WAFER | 155 nm | 155 nm | 155 nm | 30 nm |
| FRONT SURFACE OXIDE FILM OF THE BOND WAFER (BURIED OXIDE FILM) | 30 nm | 30 nm | 30 nm | 30 nm |
| H ION IMPLANTAION | 30 KeV, 5e16 cm$^{-2}$ | 30 KeV, 5e16 cm$^{-2}$ | 30 KeV, 1.5e16 cm$^{-2}$ | 30 KeV, 5e16 cm$^{-2}$ |
| He ION IMPLANTAION | — | — | 50 KeV, 1e16 cm$^{-2}$ | 50 KeV, 1e16 cm$^{-2}$ |
| BONDING PROCESS | BONDING AT ROOM TEMPERATURE | BONDING AT ROOM TEMPERATURE | BONDING AT ROOM TEMPERATURE | BONDING AT ROOM TEMPERATURE |
| DELAMINATION HEAT TREATMENT | 500° C., 30 min | 500° C., 30 min | 500° C., 30 min | 500° C., 30 min |
| TEMPERATURE-DECREASING RATE | 2.0° C./min | 2.0° C./min | 2.5° C./min | 3.0° C./min |
| TAKE-OUT TEMPERATURE | 250° C. | 250° C. | 250° C. | 350° C. |
| INCIDENCE OF SCRATCHES | 0% | 0% | 0% | 50% |
| INCIDENCE OF SOI FILM THICKNESS DISTRIBUTION ABNORMALITIES | 0% | 0% | 0% | 100% |

As shown in Table 2, in Examples 2 to 4 in which a silicon single crystal wafer having the back surface oxide film thicker than the front surface oxide film was used as the bond wafer according to the present invention, both the incidence of scratches and the incidence of SOI film thickness distribution abnormalities were 0%, and an excellent SOI wafer could be manufactured.

Moreover, in Example 4, although the coimplantation was performed in the ion implantation, the above-explained excellent SOI wafer could be obtained unlike in the conventional manner.

On the other hand, in Comparative Example 7 in which the temperature-decreasing rate and the take-out temperature were different from those of the present invention, the incidence of scratches and the incidence of SOI film thickness distribution abnormalities were high values of 50% and 100%, respectively.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing an SOI wafer, comprising:
   implanting one or more gas ion selected from a hydrogen ion and a rare gas ion into a bond wafer composed of a semiconductor single crystal substrate from a surface of the bond wafer to form an ion-implanted layer;
   bonding the surface from which the ion is implanted into the bond wafer and a surface of a base wafer through an oxide film; and then
   delaminating the bond wafer at the ion-implanted layer by performing a delamination heat treatment with a heat treatment furnace to form the SOI wafer, wherein after the delamination heat treatment, a temperature of the heat treatment furnace is decreased to 250° C. or less at temperature-decreasing rate of less than 3.0° C/min, and then the SOI wafer and the bond wafer after delamination are taken out from the heat treatment furnace.

2. The method for manufacturing an SOI wafer according to claim 1, wherein a semiconductor single crystal substrate having a front surface oxide film and a back surface oxide film is prepared as the bond wafer for forming the ion-implanted layer to implant the ion through the front surface oxide film, the back surface oxide film being thicker than the front surface oxide film.

3. The method for manufacturing an SOI wafer according to claim 2, wherein a wafer is used as the semiconductor single crystal substrate having the back surface oxide film thicker than the front surface oxide film, the wafer being manufactured by forming a thermal oxide film on all surfaces of a semiconductor single crystal substrate, then removing a portion of the thermal oxide film on a front surface side to obtain a semiconductor single crystal substrate having the thermal oxide film only on a back surface side thereof, and thermally oxidizing the semiconductor single crystal substrate having the thermal oxide film only on the back surface side.

4. The method for manufacturing an SOI wafer according to claim 3, wherein before the semiconductor single crystal substrate having the thermal oxide film only on the back surface side is thermally oxidized, the front surface side on which the portion of the thermal oxide film has been removed is polished.

5. The method for manufacturing an SOI wafer according to claim 2 wherein a wafer manufactured by subjecting the bond wafer delaminated at the ion-implanted layer to a reclaiming process is used as the semiconductor single crystal substrate having the back surface oxide film thicker than the front surface oxide film.

6. The method for manufacturing an SOI wafer according to claim 3, wherein a wafer manufactured by subjecting the bond wafer delaminated at the ion-implanted layer to a reclaiming process is used as the semiconductor single crystal substrate having the back surface oxide film thicker than the front surface oxide film.

7. The method for manufacturing an SOI wafer according to claim 4, wherein a wafer manufactured by subjecting the bond wafer delaminated at the ion-implanted layer to a reclaiming process is used as the semiconductor single crystal substrate having the back surface oxide film thicker than the front surface oxide film.

8. The method for manufacturing an SOI wafer according to claim 5, wherein the reclaiming process is performed without removing the back surface oxide film of the delaminated bond wafer.

9. The method for manufacturing an SOI wafer according to claim 6, wherein the reclaiming process is performed without removing the back surface oxide film of the delaminated bond wafer.

10. The method for manufacturing an SOI wafer according to claim 7, wherein the reclaiming process is performed without removing the back surface oxide film of the delaminated bond wafer.

11. The method for manufacturing an SOI wafer according to claim 1, wherein the ion implantation is performed by a coimplantation of a hydrogen ion and a helium ion such that the helium ion is implanted more deeply than the hydrogen ion.

12. The method for manufacturing an SOI wafer according to claim 1, wherein the delamination heat treatment is carried out at a temperature of 400° C. or more.

13. The method for manufacturing an SOI wafer according to claim 1, wherein the delamination heat treatment is carried out at a temperature of from 400 to 600° C.

14. The method for manufacturing an SOI wafer according to claim 1, wherein the temperature-decreasing rate is 2.5° C/min or less.

15. The method for manufacturing an SOI wafer according to claim 1, wherein the temperature-decreasing rate is 2.5° C/min or less, but not less than 1.0° C/min.

* * * * *